United States Patent
Capasso et al.

(10) Patent No.: US 7,750,374 B2
(45) Date of Patent: Jul. 6, 2010

(54) PROCESS FOR FORMING AN ELECTRONIC DEVICE INCLUDING A TRANSISTOR HAVING A METAL GATE ELECTRODE

(75) Inventors: Cristiano Capasso, Austin, TX (US); Srikanth B. Samavedam, Austin, TX (US); Eric J. Verret, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 381 days.

(21) Appl. No.: 11/559,633

(22) Filed: Nov. 14, 2006

(65) Prior Publication Data
US 2008/0111155 A1 May 15, 2008

(51) Int. Cl.
*H01L 29/78* (2006.01)

(52) U.S. Cl. .................. 257/204; 257/69; 257/350; 257/351; 257/369; 257/371; 257/E27.046; 257/E27.064; 257/E27.108; 257/E21.632; 438/199

(58) Field of Classification Search ............. None
See application file for complete search history.

(56) References Cited

U.S. PATENT DOCUMENTS

| | | | |
|---|---|---|---|
| 6,339,232 B1 | 1/2002 | Takagi | |
| 6,580,104 B1 | 6/2003 | U'Ren | |
| 6,797,553 B2 * | 9/2004 | Adkisson et al. | 438/202 |
| 7,098,516 B2 * | 8/2006 | Colombo et al. | 257/412 |
| 7,226,826 B2 * | 6/2007 | Alshareef et al. | 438/199 |
| 7,229,873 B2 * | 6/2007 | Colombo et al. | 438/231 |
| 7,393,733 B2 * | 7/2008 | Currie | 438/164 |
| 7,429,776 B2 * | 9/2008 | Koyama et al. | 257/407 |
| 2003/0235082 A1 * | 12/2003 | Hsu et al. | 365/185.29 |
| 2005/0136677 A1 * | 6/2005 | Brask et al. | 438/706 |
| 2005/0230781 A1 * | 10/2005 | Ema et al. | 257/510 |
| 2005/0274978 A1 | 12/2005 | Antoniadis et al. | |
| 2006/0071285 A1 * | 4/2006 | Datta et al. | 257/407 |
| 2006/0226453 A1 * | 10/2006 | Wang et al. | 257/288 |
| 2006/0267895 A1 * | 11/2006 | Yanase | 345/92 |
| 2007/0132033 A1 * | 6/2007 | Wu et al. | 257/371 |
| 2007/0252216 A1 * | 11/2007 | Muhammad | 257/369 |

OTHER PUBLICATIONS

Donald A. Newmen. Semiconductor Physics and Devices Basic Principles. United States of America: Irwin/ McGraw Hill, 1997.*

(Continued)

*Primary Examiner*—Minh-Loan T Tran
*Assistant Examiner*—Fei Fei Yeung Lopez (57) ABSTRACT

An electronic device includes an n-channel transistor and a p-channel transistor. The p-channel transistor has a first gate electrode with a first work function and a first channel region including a semiconductor layer immediately adjacent to a semiconductor substrate. In one embodiment, the first work function is less than the valence band of the semiconductor layer. In another embodiment, the n-channel transistor has a second gate electrode with a second work function different from the first work function and closer to a conduction band than a valence band of a second channel region. A process of forming the electronic device includes forming first and second gate electrodes having first and second work functions, respectively. First and second channel regions having a same minority carrier type are associated with the first and second gate electrodes, respectively.

20 Claims, 3 Drawing Sheets

OTHER PUBLICATIONS

Wang et al., "Low Power Device Technology with SiGe Channel, HfSiON, and Poly-Si Gate," 2004 IEEE, 0-7803-8684-1, IEDM 04, pp. 161-164.

Lander et al., "High Hole Mobilities in Fully-Strained Si(1−x)Ge(x) Layers (0.3<x<0.4) and their Significance for SiGe pMOSFET Performance," IEEE Transactions on Electron Devices, vol. 48, No. 8, Aug. 2001, pp. 1826-1832.

Krishnamohan et al., "High-Mobility Low Band-to-Band-Tunneling Strained-Germanium Double-Gate Heterostructure FETs: Simulations," IEE Transactions of Electron Devices, vol. 53, No. 5, May 2006, pp. 1000-1009.

Weber et al., "Fabrication and Mobility Characteristics of SiGe Surface Channel pMOSFETs with a HfO2/TiN Gate Stack," IEEE Transactions on Electron Devices, vol. 53, No. 3, Mar. 2006, pp. 449-456.

Bera et al., "A Dual-Strained CMOS Structure THrough Simultaneous Formation of Relaxed and Compressive Strained-SiGe-on-Insulator," IEEE Electron Device Letters, vol. 27, No. 5, May 2006, pp. 350-353.

* cited by examiner

PROCESS FOR FORMING AN ELECTRONIC DEVICE INCLUDING A TRANSISTOR HAVING A METAL GATE ELECTRODE

RELATED APPLICATION

The present disclosure relates to U.S. patent application Ser. No. 11/559,642, entitled "Electronic Device Including a Heterojunction Region and a Process for Forming the Electronic Device" by Winstead, et. al. filed on Nov. 14, 2006, which is assigned to the current assignee hereof and incorporated by reference in its entirety.

BACKGROUND

1. Field of the Disclosure

The present disclosure relates to electronic devices, more particularly, to electronic devices that include transistors having metal gate electrodes and a process for forming them.

2. Description of the Related Art

Many semiconductor manufacturing facilities run a mixture of products with different requirements in order to remain full and profitable. Thus managing cost and complexity trade-offs on a manufacturing line where a mixture of highly integrated products with different requirements are made can be particularly problematic and expensive.

For example, a substrate surface, as obtained from a commercially-available source, normally supports one transistor type. In order to form both a p-channel transistor and an n-channel transistor, another region of the substrate that includes a material that supports the other transistor type can be formed adding expense to the process. One method is to remove and replace portions of the substrate. If the substrate is a silicon-on-insulator substrate, another method is to expose a portion of the base layer and form the other transistor type there. Still another method is to deposit a SiGe layer that is greater than one micron thick over the substrate such that a surface of the SiGe layer opposite a surface of the SiGe layer closest to the substrate includes relaxed SiGe material. However, such methods require long processes be used that are both time consuming and expensive to perform. As an alternative to using long etch processes, the n-channel transistor and the p-channel transistors are formed at substantially different elevations. However, this adds complexity to both imaging and planarization processing during manufacturing.

As another example, threshold voltage ("Vth") requirements can be different between high performance and low power components. High performance components have a low Vth to decrease the time for switching between states while low power components have a high Vth to reduce off-state leakage current. As such, high performance n-channel components have gate electrode work functions closer to the conduction band than the valence band of the channel region and high performance p-channel components have work functions closer to the valence band than the conduction band of the channel region. In low power components, a single gate electrode material with a work function approximately equally between the valence band and the conduction band can be used to reduce the processing cost over a two gate electrode process. Thus, if both high performance and low power components are integrated together on a single substrate, at least three separate gate electrode processes would have to be developed and maintained.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device includes an n-channel and a first p-channel transistor having a first gate electrode with a first work function and a first channel region including a semiconductor layer immediately adjacent to a semiconductor substrate. In a first aspect, the first p-channel transistor includes the first channel region and the semiconductor layer lying immediately adjacent to the semiconductor substrate. The semiconductor substrate can have a first semiconductor composition. The semiconductor layer has a second semiconductor composition different from the first semiconductor composition, and the semiconductor layer has a thickness of at most approximately 10 nm. The first p-channel transistor can also include a first metal gate electrode associated with the first channel region and having a first work function less than a valence band of the semiconductor layer.

In a second aspect, the first transistor is a p-channel transistor and the electronic device can also include an n-channel transistor including, a second channel region lying within a semiconductor substrate having a first semiconductor composition, and a first metal gate electrode having a first work function closer to a conduction band than a valence band of the first channel region. The semiconductor layer can have a second semiconductor composition different from the first semiconductor composition, and the semiconductor layer can have a thickness of at most 10 nm. The p-channel transistor can also include a second metal gate electrode can have a second work function different from the first work function.

In a third aspect, a process for forming an electronic device can include forming a semiconductor layer immediately adjacent to a semiconductor substrate. The process can also include forming a first metal layer over the semiconductor layer wherein the first metal layer has a first work function, and forming a second metal layer over the semiconductor layer, wherein the second metal layer has a second work function different from the first work function. The process can further include forming a first metal gate electrode over the semiconductor layer wherein, the first metal gate electrode can include a portion of the first metal layer, and the first metal gate electrode substantially can have the first work function. A first channel region associated with the first metal gate electrode can have a first minority carrier type. The process can also include forming a second metal gate electrode over the semiconductor layer wherein, the second metal gate electrode can include a portion of the second metal layer, and the second metal gate electrode substantially can have the second work function. A second channel region associated with the second metal gate electrode can have the first minority carrier type.

In accordance with the present disclosure, an electronic device includes an n-channel transistor and a p-channel transistor, wherein the p-channel transistor has a first channel region including a semiconductor layer with a thickness of at most approximately 10 nm and an associated metal gate electrode. In one embodiment, a single gate material is used for both the n-channel transistor and the p-channel transistor designs to reduce complexity of a low power complimentary metal-oxide semiconductor ("CMOS") process flow. In an alternative embodiment, gate electrode materials having a work function lower than the conductance band are used to form gate electrodes for low power n-channel components, low power p-channel components, and high performance n-channel components within a same electronic device. In a more particular embodiment, a same gate electrode material can be used to form gate electrodes for low power n-channel components, low power p-channel components, and high performance n-channel components. Thus, both n-channel and p-channel low power components are added to a high performance CMOS components to form an electronic device without adding a metal gate electrode with a third work function to the electronic device. Specific embodiments of the present disclosure will be better understood with reference to FIGS. 1 through 8.

Some terms are defined or clarified as to their intended meaning as they are used within this specification.

The term "composition" is intended to indicate a group of elements in a specific ratio of materials. For example a semiconductor composition is a ratio of semiconductor materials within a layer or feature, such as $Si_xGe_y$, $Si_{(x-a)}Ge_{(y+a)}$, where "a" is a value between approximately 0 and approximately "x", would be considered a different semiconductor composition from $Si_xGe_y$. As used herein, subscripts on compound materials specified with alphabetic subscripts are intended to represent the non-zero fraction of the atomic species present in that compound, and therefore, the alphabetic subscripts within a compound sum to 1. For example, in the case of $Si_aGe_bC_c$, the sum of "a," "b," and "c" is 1.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "metal gate electrode" is intended to mean a gate electrode including a metal-containing portion, which substantially sets the work function for the gate electrode. A metal gate electrode may or may not include Si, Ge, C, or any combination thereof. An example of a metal-containing portion of a metal gate electrode can include a metal element, a metal alloy, metal compound, (e.g., a metal nitride or a metal oxide), or any combination thereof.

The term "semiconductor material" is intended to indicate a semiconductor element, semiconductor elements, or a combination of elements having semiconductor properties within a layer or feature exclusive of dopant material. For example, a boron doped $Si_xGe_y$ layer with a concentration of 1 E21 atoms per cubic centimeter has the same semiconductor material as an undoped $Si_xGe_y$ layer. Alternatively, a semiconductor material includes a III-V material, such as GaAs, InP, or the like, or a II-VI material, such as CdS, ZnSe, or the like.

The term "semiconductor substrate" is intended to mean a substrate having a semiconductor layer on which a device can be formed. A semiconductor substrate can include a buried insulating layer. Examples of semiconductor substrates include bulk silicon wafers, a silicon on sapphire substrate, semiconductor-on-insulator wafers, or the like.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 1:
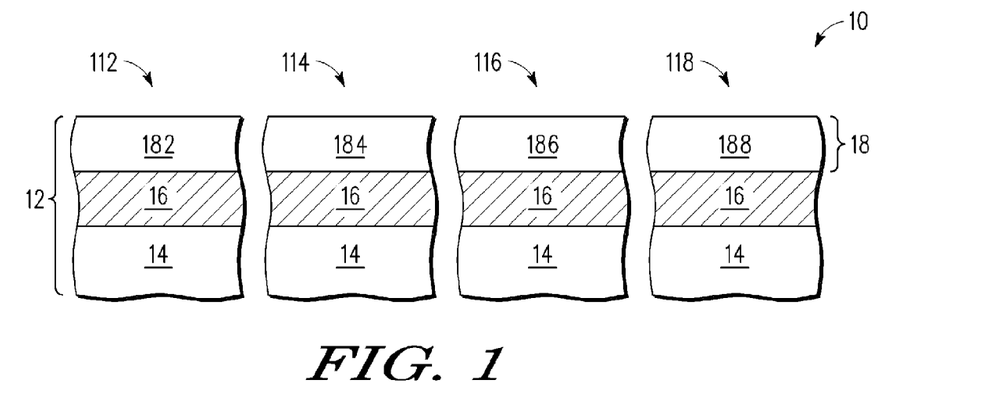
FIG. 1 includes an illustration of a cross-sectional view of a semiconductor substrate including four locations where components can be formed.

FIG. 1 includes a cross-sectional view of an illustration of a portion of a workpiece 10 including a portion of a semiconductor substrate 12 including a location 112, a location 114, a location 116, and a location 118 where components can subsequently be formed. In the illustrated embodiment, the semiconductor substrate 12 is a semiconductor-on-insulator ("SOI") substrate that includes a base layer 14, an insulating layer 16, and a semiconductor layer 18. Although illustrated as SOI substrate, in another embodiment, the semiconductor substrate 12 can include a different type of semiconductor substrate.

In the illustrated embodiment, the base layer 14 includes a support layer and provides mechanical support for the other layers of the substrate 12. The base layer 14 includes substantially any material physically strong enough to support the substrate 12 and compatible with the subsequent processing. In a particular embodiment, the base layer 14 includes a semiconductor material. The insulating layer 16 is a buried insulating layer and provides electrical insulation between the base layer 14 and the semiconductor layer 18. The insulating layer 16 can include an oxide, a nitride, an oxynitride, or any combination thereof.

The semiconductor layer 18 includes a semiconductor material such as silicon, germanium, carbon, or any combination thereof, and has a substantially uniform thickness in a range of approximately 25 to approximately 150 nm. The semiconductor layer 18 includes an n-type dopant, a p-type dopant, or any combination thereof. The semiconductor layer 18 includes an active region 182, an active region 184, an active region 186, and an active region 188 at the location 112, the location 114, the location 116 and the location 118, respectively. As compared to each other, the active region 182, the active region 184, the active region 186, and the active region 188 can include a same dopant type or different dopant types and support a same type or different types of transistors (e.g., n-channel transistor or p-channel transistor). In one embodiment, the active region 182 and the active region 184 have a first dopant type, and the active region 186 and the active region 188 have a second dopant type different from the first dopant type. In a particular embodiment, a low power p-channel transistor is subsequently formed and includes the active region 182, a high performance p-channel transistor is subsequently formed and a includes the active region 184, a low power n-channel transistor is subsequently formed and includes the active region 186, and a high performance n-channel transistor is subsequently formed and includes the active region 188. The semiconductor layer 18 can also include field isolation regions (not illustrated) to provide electrical isolation such that each of the active region 182, the active region 184, the active region 186, and the active region 188 are electrically isolated from one another and the other active regions.

Figure 2:
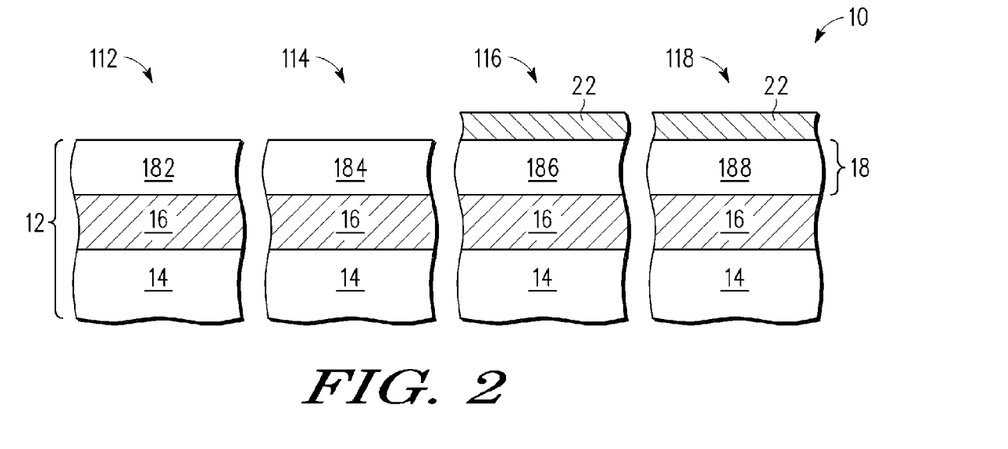
FIG. 2 includes an illustration of a cross-sectional view of the workpiece of FIG. 1 after forming a protective layer.

FIG. 2 includes an illustration of a cross-sectional view of the workpiece 10 after forming a protective layer 22 over the semiconductor substrate 12. In the illustrated embodiment, the protective layer 22 is formed over the active region 186 and the active region 188, and the active region 182 and the active region 184 remain exposed. The protective layer 22 can be used as a hard mask to protect underlying portions of the semiconductor substrate 12 from subsequent processing. The material of the protective layer 22 can be selected such that a process designed to react at the exposed surface of the semiconductor substrate 12 at the location 112 and the location 114 will substantially not react at the surface of the protective layer 22 at the location 116 and the location 118. In another embodiment, the protective layer 22 can serve as an etch-stop layer such that a subsequently deposited layer (not illustrated) can be removed from the protective layer 22 without exposing the underlying regions of the semiconductor substrate 12. The protective layer 22 can include an oxide, a nitride, an oxynitride, another material resistant to appropriate processing conditions, or any combination thereof. The protective layer 22 can have a thickness in a range of approximately 3 nm to approximately 100 nm and be grown or deposited using a conventional or proprietary process, and in one embodiment, has a thickness in a range of approximately 5 to approximately 10 nm. Although illustrated as overlying the active region 186 and the active region 188, in an alternative embodiment, the protective layer 22 can overlie the active region 182, the active region 184, the active region 186, the active region 188 or any combination thereof.

Figure 3:
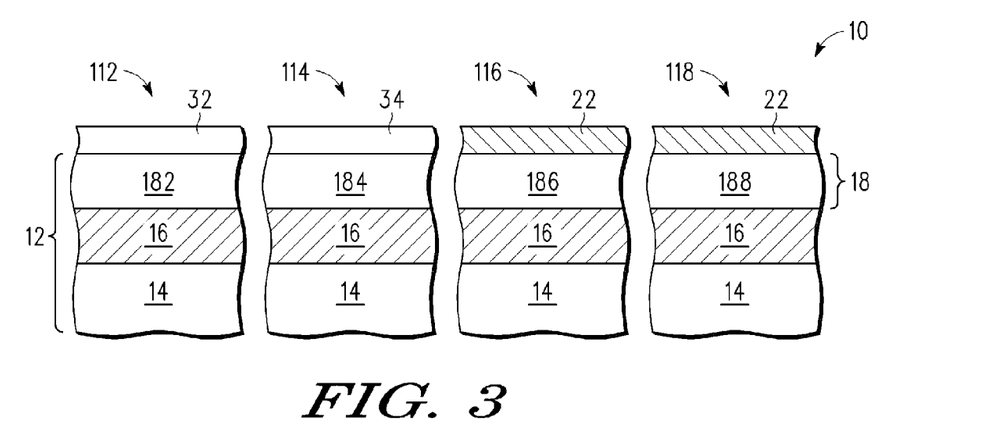
FIG. 3 includes an illustration of a cross-sectional view of the workpiece of FIG. 2 after forming a semiconductor layer over a portion of the semiconductor substrate.

FIG. 3 includes an illustration of a cross-sectional view of the workpiece 10 after forming a semiconductor layer 32 over an exposed portion of the semiconductor substrate 12. In the illustrated embodiment, the semiconductor layer 32 is formed over the active region 182 and the semiconductor layer 34 over the active region 184 of the semiconductor substrate 12. The semiconductor layer 32 can be deposited using a conventional or proprietary process. In one embodiment, the semiconductor layer 32 is formed by epitaxial growth. In another embodiment, the semiconductor layer 32 is blanket deposited, and the portion of the semiconductor layer 32 overlying the protective layer 22 is later removed. The semiconductor layer 32 may or may not include a dopant. In a particular embodiment, the semiconductor layer 32 is doped during the formation process. By distributing the dopant during the deposition process, the dopant profile of a subsequently formed channel region is substantially confined within the semiconductor layer 32. In another embodiment, the semiconductor layer 32 is doped subsequent to the completion of the formation of the semiconductor layer 32.

In the illustrated embodiment, the semiconductor layer 32 has a different semiconductor composition than the active region it overlies. In one embodiment, the semiconductor layer 32 is a silicon germanium layer and has a germanium concentration of at most approximately 45 atomic percent germanium. In a particular embodiment, the semiconductor layer 32 has a germanium concentration in a range of approximately 20 to approximately 30 atomic percent. In a more particular embodiment, the semiconductor layer 32 has a concentration of approximately 25 atomic percent germanium. The semiconductor layer 32 can have a lattice constant different then the lattice constant of the active region 182 at the same temperature, such as 0 degrees centigrade. In one embodiment, the semiconductor layer 32 has a compressive stress. The semiconductor layer 32 has a different dopant type from the active region 186 or the active region 188. In one embodiment, the semiconductor layer 32 has a dopant concentration in a range of 1 E16 to 2 E19 atoms per cubic centimeter. In a particular embodiment, the semiconductor layer 32 includes boron at a concentration of approximately 1 E19 atoms per cubic centimeter. In another embodiment, the semiconductor layer 32 has a thickness of at most approximately 10 nm, and in still another embodiment, has a thickness of at least approximately 2 nm. In a particular embodiment, the semiconductor layer 32 has a thickness in a range of approximately 5 to approximately 10 nm.

The semiconductor layer 34 at the location 114 is formed by an embodiment previously described with respect to the semiconductor layer 32 at the location 112. With respect to the semiconductor layer 32, the semiconductor layer 34 is formed by a same or different process at a same or different time, and has a same or different doping concentration, has a same or different thickness, has a same or different semiconductor composition, has a same or different strain, or any combination thereof. In a particular embodiment, the semiconductor layer 32 includes an n-type dopant at a concentration of approximately 1 E19 atoms per cubic centimeter, and the semiconductor layer 34 is substantially undoped. The protective layer 22 is removed at the location 116 and the location 118 using a conventional or proprietary process to expose a portion of the active region 186 and the active region 188.

Figure 4:
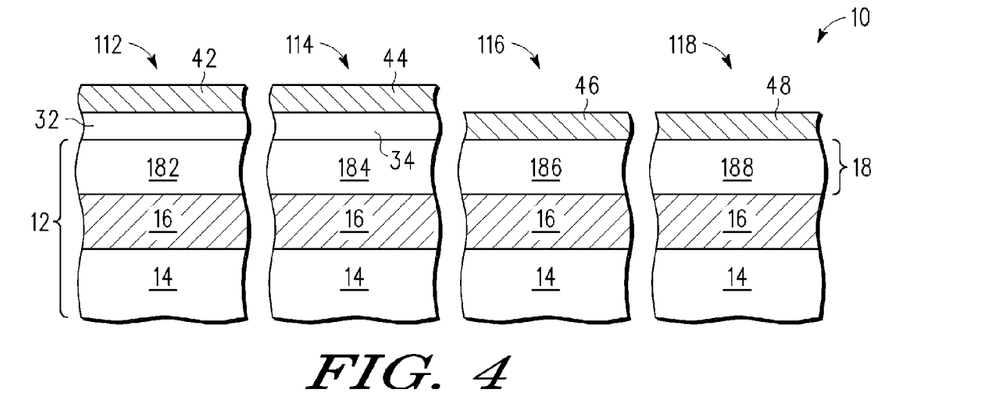
FIG. 4 includes an illustration of a cross-sectional view of the workpiece of FIG. 3 after forming a dielectric layer.

FIG. 4 includes an illustration of a cross-sectional view of the workpiece 10 after forming a dielectric layer 42, a dielectric layer 44, a dielectric layer 46, and a dielectric layer 48 over the workpiece 10 at the location 112, the location 114, the location 116, and the location 118, respectively. The dielectric layer 42, the dielectric layer 44, the dielectric layer 46, and the dielectric layer 48 can each act as a gate dielectric layer.

In the illustrated embodiment, the dielectric layer 42 includes a dielectric material such as silicon dioxide, silicon nitride, silicon oxynitride, a high dielectric constant ("high-k") material (e.g., dielectric constant greater than 8), or any combination thereof. The high-k material includes $Al_aO_b$, $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Ti_aO_b$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1.

As illustrated, the dielectric layer 42 may be thermally grown in an oxidizing or nitridizing ambient using a conventional or proprietary process. In another embodiment, the dielectric layer 42 is deposited using a conventional or proprietary chemical vapor deposition ("CVD") technique, physical vapor deposition ("PVD") technique, atomic layer deposition ("ALD") technique, or any combination thereof In such a case, additional processing, such as masking and etch processes, may be used to remove portions of the dielectric layer 42 overlying the workpiece 10. The dielectric layer 42 has a thickness in a range of approximately 1 to approximately 25 nm.

The dielectric layer 44, the dielectric layer 46, and the dielectric layer 48 are each formed by an embodiment as previously described for the dielectric layer 42. As compared to the dielectric layer 42 and each other, the dielectric layer 44, the dielectric layer 46 and the dielectric layer 48 each has a same or different material composition, is formed at the same or different time using a same or different embodiment, has a same or different thickness, or any combination thereof as compared to the other dielectric layers. In a particular embodiment, the dielectric layer 42, the dielectric layer 44, the dielectric layer 46, the dielectric layer 48, or any combination thereof includes a high-k dielectric material.

Figure 5:
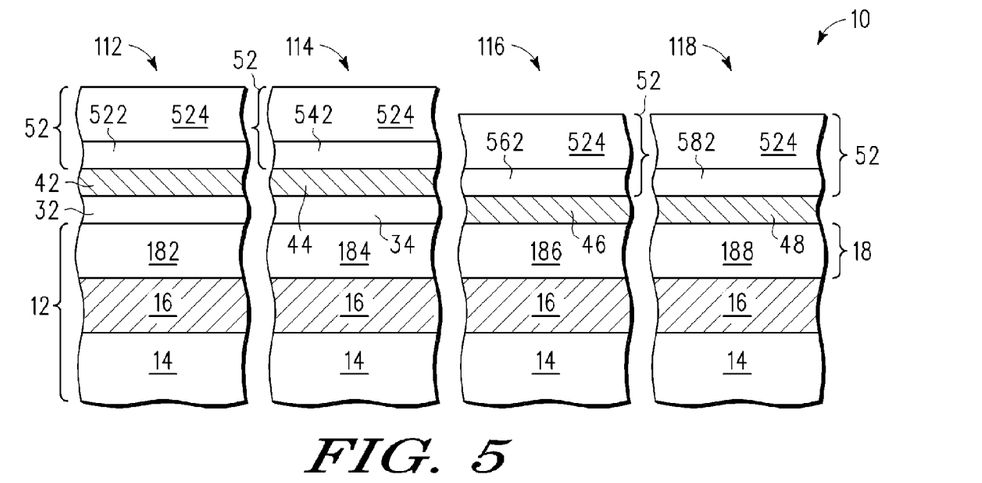
FIG. 5 includes an illustration of a cross-sectional view of the workpiece of FIG. 4 after forming a conductive layer.

FIG. 5 includes an illustration of a cross-sectional view of the workpiece 10 of FIG. 4 after forming a conductive layer 52 at the location 112, the location 114, the location 116, and the location 118. In the illustrated embodiment, the conductive layer 52 includes a first film 522 and a conductive film 524 at the location 112 and a second film 542 and a conductive film 524 at the location 114. Further, the conductive layer 52 includes a third film 562 and a conductive film 524 at the location 116 and a fourth film 582 and a conductive film 524 at the location 18.

In a particular embodiment, the first metal film 522, the second metal film 542, the third metal film 562, the fourth metal film 582, or any combination thereof includes a metal with a work function less than the valence band of the semiconductor layer 32. In a more particular embodiment, the first metal film 522, the second metal film 542, the third metal film 562, the fourth metal film 582, or any combination thereof includes a metal with a work function closer to the conduction band than a midpoint value between the conduction band and the valence band of the semiconductor layer 32. In another particular embodiment, the first metal film 522, the second metal film 542, the third metal film 562, the fourth metal film 582, or any combination thereof includes a metal with a work function closer to a conduction band than a valence band of the of the semiconductor layer 18. In a more particular embodiment, the first metal film 522, the second metal film 542, the third metal film 562, the fourth metal film 582, or any combination thereof includes TaC, $Mo_2N$, or any combination thereof The first metal film 522, the second metal film 542, the third metal film 562, the fourth metal film 582, or any combination thereof have a same or different compositions as compared to one another. In a still more particular embodiment, the second metal film 542 includes $Mo_2N$, and the first metal film 522, the third metal film 562, and the fourth metal film 582 include TaC. Each of the first metal film 522, the second metal film 542, the third metal film 562, the fourth metal film 582, or any combination thereof has a thickness of at least approximately 3 nm and in one embodiment, has a thickness in a range of approximately 5 to approximately 15 nm.

The conductive film 524 is designed to reduce the resistance to current flow for the subsequently formed metal gate electrode when the metal gate electrode would be on. The conductive portion 524 can include a doped semiconductor material, a metal, or any combination thereof. The conductive film 524 has a thickness in a range of approximately 20 to approximately 150 nm. In one embodiment, the conductive portion 524 can have a thickness in a range of approximately 30 to approximately 90 nm.

Although not illustrated, an additional film can be present between the conductive film 524 and its underlying dielectric layers. For example, at the location 112, a portion of the second metal film 542, the third metal film 562, the fourth metal film 582, or portions of any combination of those metal films can lie between the first metal film 522 and the conductive film 524. Similar alternative embodiments may be formed at other locations.

Each of the films within the conductive layer 52 is formed by deposition using a conventional or proprietary CVD process, PVD process, ALD process or any combination thereof. Each of the films within the conductive layer 52 is patterned using a conventional or proprietary lithographic process in order to remove a metal film from a location where such a metal film is not to remain in a finished electronic device.

Figure 6:
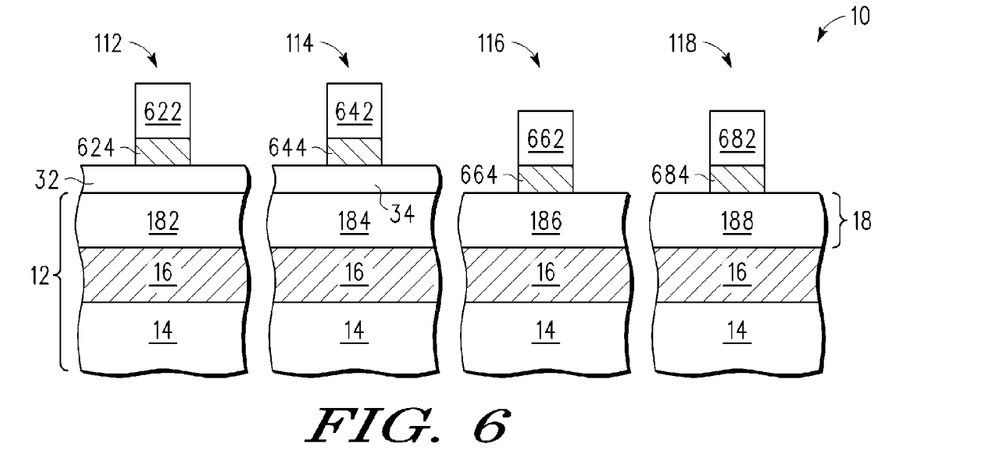
FIG. 6 includes an illustration of a cross-sectional view of the workpiece of FIG. 5 after forming a metal gate electrode at each of the four locations.

FIG. 6 includes an illustration of a cross-sectional view of the workpiece 10 of FIG. 5 after forming a metal gate electrode 622 and gate dielectric 624 at the location 112, a metal gate electrode 642 and gate dielectric 644 at the location 114, a metal gate electrode 662 and gate dielectric 664 at the location 116, and a metal gate electrode 682 and gate dielectric 684 at the location 118.

A patterned layer (not illustrated) is formed over the conductive layer 52 (illustrated in FIG. 5) protecting a portion of the conductive layer 52 at the location 112, the location 114, the location 116, and the location 118. Exposed portions of the conductive layer 52, and subsequently exposed portions of the dielectric layer 42, the dielectric layer 44, the dielectric layer 46, the dielectric layer 48, or any combination thereof are removed using a conventional or proprietary process. In one embodiment, the metal gate electrode 622 has a work function less than the valence band of the semiconductor layer 32. In another embodiment, the metal gate electrode 642 has a work function closer to a conduction band than a valence band of the semiconductor layer 32. In still another embodiment, the metal gate electrode 662, the metal gate electrode 682, or any combination thereof has a work function less than the valence band of the semiconductor layer 18 of the semiconductor substrate 12.

Figure 7:
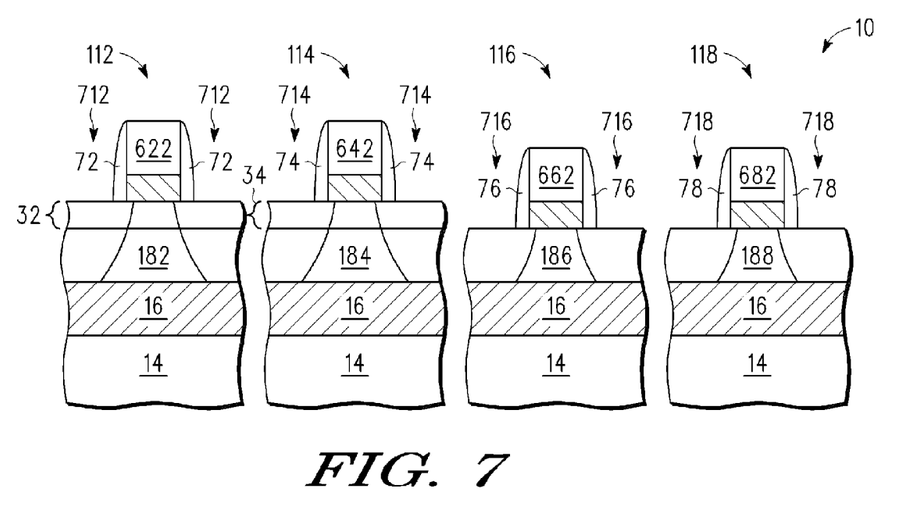
FIG. 7 includes an illustration of a cross-sectional view of the workpiece of FIG. 6 after forming transistors at each of the four locations.

FIG. 7 includes an illustration of a cross-sectional view of the workpiece 10 of FIG. 6 after forming spacer structure 72 and doped regions 712 at the location 112, spacer structure 74 and doped regions 714 the location 114, spacer structure 76 and doped regions 716 the location 116, and spacer structure 78 and doped regions 718 the location 118.

The spacer structure 72, the spacer structure 74, the spacer structure 76, and the spacer structure 78 are formed adjacent to the metal gate electrode 622, the metal gate electrode 642, the metal gate electrode 662, and the metal gate electrode 682 respectively. The spacer structure 72, the spacer structure 74, the spacer structure 76, and the spacer structure 78 include an oxide, a nitride, an oxynitride, or any combination thereof. In a particular embodiment, the metal gate electrode 642 includes $Mo_2N$ and the spacer structure 74 includes a nitride layer closer to the metal gate electrode 642 than any other portion of the spacer structure 74. As compared to each other the spacer structure 72, the spacer structure 74, the spacer structure 76, and the spacer structure 78 each are formed of a same or different material, at a same or different time, using a same or different, conventional or proprietary CVD process, PVD process, or ALD process.

Dopant is introduced to the substrate 12 to form the doped regions 712, the doped regions 714, the doped regions 716, and the doped regions 718. The doped regions 712, the doped regions 714, the doped regions 716, and the doped regions 718 act as a source region, a drain region, or a source/drain region for a transistor at the location 112, the location 114, the location 116, and the location 118, respectively. As compared to each other the doped regions 712, the doped regions 714, the doped regions 716, and the doped regions 718 each are formed of a same or different material, at a same or different time, using a same or different, conventional or proprietary process.

Figure 8:
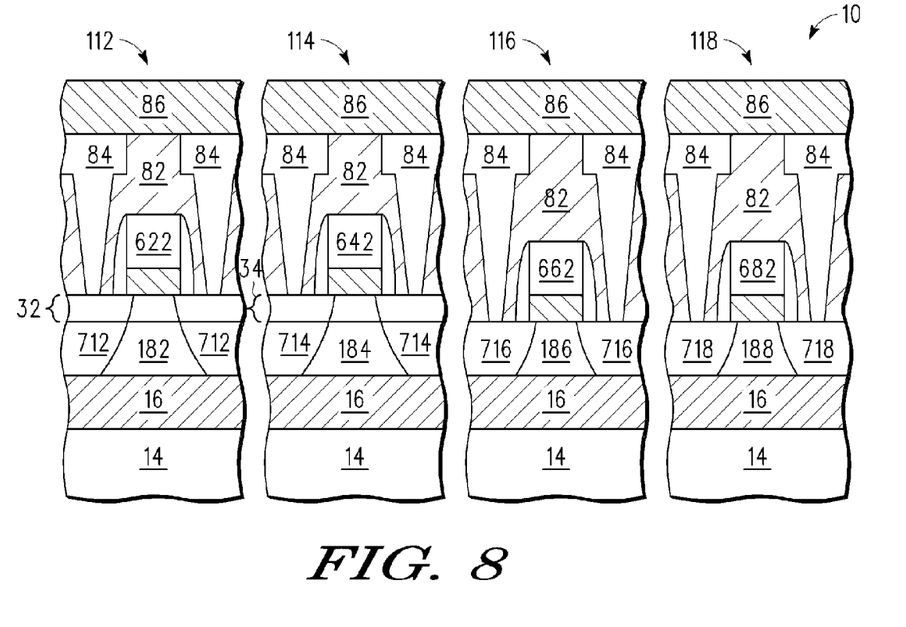
FIG. 8 includes an illustration of a cross-sectional view of a substantially complete electronic device.

FIG. 8 includes an illustration of a cross-sectional view of a substantially completed electronic device. An insulating layers 82, an interconnect layers 84, and an encapsulating layers 86 are formed using a conventional or proprietary technique. In another embodiment (not illustrated), an additional insulating layer, interconnect layer, encapsulating layer, or any combination thereof can be formed.

An electronic device is formed including the transistor at the location 112, the transistor at the location 114, the transistor at the location 116, the transistor at the location 118, or any combination thereof. In a particular embodiment, the transistor at the location 112 is a low power p-channel transistor, the transistor at the location 114 is a high performance p-channel transistor, the transistor at the location 116 is a low power n-channel transistor, and the transistor at the location 118 is a high performance n-channel transistor. In one embodiment, both high performance and low power, n-channel and p-channel transistors are formed by including the transistor at the location 112, the transistor at the location 114, the transistor at the location 116, the transistor at the location 118. In another embodiment, a low power electronic device is formed by including the transistor at the location 112 and the transistor at the location 116. In another embodiment, a high performance electronic device is formed by including the transistor at the location 114 and the transistor at the location 118.

Thus a single metal gate can be used to form high performance n-channel transistors, low power n-channel transistors, and low power p-channel transistors so that an electronic device including high performance components, low power components, or any combination thereof can be formed using a substantially same starting substrate and only two gate electrode processes. By increasing the process similarity between the high performance and low power devices, a cost benefit can be realized in a manufacturing line that runs both types of products. Additionally, low power components can be integrated with high performance components more easily to form a single high performance electronic device that consumes less power than a similar device using only high power components.

Many different aspects and embodiments are possible. Some of those aspects and embodiments are described below. After reading this specification, skilled artisans will appreciate that those aspects and embodiments are only illustrative and do not limit the scope of the present invention.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

In a first aspect, an electronic device can include an n-channel transistor and a first p-channel transistor. The first p-channel transistor can include a first channel region. The first channel region can include a semiconductor layer lying immediately adjacent to a semiconductor substrate. The semiconductor substrate can have a first semiconductor composition. The semiconductor layer has a second semiconductor composition different from the first semiconductor composition, and the semiconductor layer has a thickness of at most approximately 10 nm. The first p-channel transistor can also include a first metal gate electrode associated with the first channel region and having a first work function less than a valence band of the semiconductor layer.

In one embodiment of the first aspect, the n-channel transistor can include, a second channel region lying within the semiconductor substrate, and a second metal gate electrode associated with the second channel region and having a second work function less than a valence band of the semiconductor substrate. In another embodiment, the first work function and the second work function have substantially a same value. In another embodiment, the first metal gate electrode and the second metal gate electrode each include TaC. In still another embodiment, the semiconductor layer includes a strained semiconductor layer.

In a particular embodiment of the first aspect, the electronic device can further include a second p-channel transistor including a second metal gate electrode overlying the semiconductor layer and having a second work function different from the first work function. In a more particular embodiment, the first p-channel transistor further includes a first source/drain region and second source/drain region, and the second p-channel transistor further includes a third source/drain region and a fourth source/drain region. A shortest distance between the first source/drain region and the second source/drain region can be longer than a shortest distance between the third source/drain region and the fourth source/drain region.

In a second aspect, an electronic device can include an n-channel transistor including, a first channel region lying within a semiconductor substrate having a first semiconductor composition, and a first metal gate electrode having a first work function closer to a conduction band than a valence band of the first channel region. The electronic device can also include a p-channel transistor including, a second channel region including a semiconductor layer lying immediately adjacent to the semiconductor substrate. The semiconductor layer can have a second semiconductor composition different from the first semiconductor composition, and the semiconductor layer can have a thickness of at most 10 nm. The p-channel transistor can also include a second metal gate electrode can have a second work function different from the first work function.

In one embodiment of the first aspect, the first metal gate electrode can include TaC, and the second metal gate electrode includes $Mo_2N$. In another embodiment, the semiconductor layer includes Si, Ge, C, or any combination thereof. In still another embodiment, the semiconductor layer is a strained semiconductor layer.

In a third aspect, a process for forming an electronic device can include forming a semiconductor layer immediately adjacent to a semiconductor substrate. The process can also include forming a first metal layer over the semiconductor layer wherein the first metal layer has a first work function, and forming a second metal layer over the semiconductor layer, wherein the second metal layer has a second work function different from the first work function. The process can further include forming a first metal gate electrode over the semiconductor layer wherein, the first metal gate electrode can include a portion of the first metal layer, and the first metal gate electrode substantially can have the first work function. A first channel region associated with the first metal gate electrode can have a first minority carrier type. The process can also include forming a second metal gate electrode over the semiconductor layer wherein, the second metal gate electrode can include a portion of the second metal layer, and the second metal gate electrode substantially can have the second work function. A second channel region associated with the second metal gate electrode can have the first minority carrier type.

In one embodiment of the third aspect, the process can further include removing a portion of the first metal layer prior to forming the second metal layer. In a particular embodiment, the process can further include doping the semiconductor layer with a boron-containing dopant. In a more particular embodiment, forming the semiconductor layer can include selectively forming the semiconductor layer. In an even more particular embodiment, selectively forming the semiconductor layer and doping the compound semiconductor layer can occur simultaneously at same point in time.

In a particular embodiment of the third aspect, the process can further include forming a third metal gate electrode wherein, substantially none of the semiconductor layer lies between the third metal gate electrode and the semiconductor substrate. A third channel region associated with the third metal gate electrode can have a second minority carrier type different from the first minority carrier type. The process can further include forming a fourth metal gate electrode wherein substantially none of the semiconductor layer lies between the fourth metal gate electrode and the semiconductor substrate. A fourth channel region associated with the fourth metal gate electrode can have the second minority carrier type. In a more particular embodiment, forming the third metal gate electrode can include removing a portion of the first metal layer, the second metal layer, or any combination thereof, and the third metal gate electrode substantially has the first work function or the second work function. The process can also include forming the fourth metal gate electrode including forming fourth metal gate electrode substantially having a same work function as the third metal gate electrode.

In another embodiment of the third aspect, forming the semiconductor layer includes forming the semiconductor layer wherein the semiconductor substrate can have a first semiconductor composition, and the semiconductor layer can have a second semiconductor composition different from the first semiconductor composition. The semiconductor layer can have a thickness of at most approximately 10 nm. In yet another embodiment, forming the first metal layer, forming the second metal layer, or any combination thereof is performed using an atomic layer deposition process.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process for forming an electronic device comprising:
   forming a semiconductor layer immediately adjacent to a semiconductor substrate;
   forming a first gate dielectric layer over and abutting the semiconductor layer;
   forming a first metal film over the first gate dielectric layer, wherein the first metal film abuts the first gate dielectric layer, includes a first metal element, and has a first work function;
   forming a second gate dielectric layer over and abutting the semiconductor layer, wherein the first and second gate dielectric layers have substantially the same composition and substantially the same thickness;
   forming a second metal film over the second gate dielectric layer, wherein the second metal film abuts the second gate dielectric layer, includes a second metal element, and has a second work function different from the first work function;
   forming a first metal gate electrode over the semiconductor layer, wherein:
      the first metal gate electrode includes a portion of the first metal film;
      the first metal gate electrode has substantially the first work function; and
      a first channel region associated with the first metal gate electrode has a first minority carrier type; and
      a first transistor includes the first metal gate electrode and the first channel region, and the first transistor has a first threshold voltage; and
   forming a second metal gate electrode over the semiconductor layer, wherein:
      the second metal gate electrode includes a portion of the second metal film;
      the second metal gate electrode has substantially the second work function;

a second channel region associated with the second metal gate electrode has the first minority carrier type; and a second transistor includes the second metal gate electrode and the second channel region, and the second transistor has a second threshold voltage, wherein a potential difference between 0 volts and the second threshold voltage is greater than a potential difference between 0 volts and the first threshold voltage.

2. The process of claim 1, further comprising removing a portion of the first metal film prior to forming the second metal film.

3. The process of claim 1, further including doping the semiconductor layer with a boron-containing dopant.

4. The process of claim 3, wherein forming the semiconductor layer includes selectively forming the semiconductor layer.

5. The process of claim 4, wherein selectively forming the semiconductor layer and doping the compound semiconductor layer occur simultaneously at same point in time.

6. The process of claim 1, further including:
forming a third gate dielectric layer over the semiconductor substrate;
forming a third metal film over the third gate dielectric layer, wherein the third metal film abuts the third gate dielectric layer, includes a third metal element, and has a third work function;
forming a third metal gate electrode over the third gate dielectric layer, wherein:
substantially none of the semiconductor layer lies between the third metal gate electrode and the semiconductor substrate;
the third metal gate electrode includes a portion of the third metal film;
the third metal gate electrode has substantially the third work function;
a third channel region associated with the third metal gate electrode has a second minority carrier type different from the first minority carrier type; and
a third transistor includes the third metal gate electrode and the third channel region, and the third transistor has a third threshold voltage;
forming a fourth gate dielectric layer over the semiconductor substrate;
forming a fourth metal film over the fourth gate dielectric layer, wherein the fourth metal film abuts the fourth gate dielectric layer, includes a fourth metal element, and has substantially the third work function; and
forming a fourth metal gate electrode, wherein:
substantially none of the semiconductor layer lies between the fourth metal gate electrode and the semiconductor substrate;
the fourth metal gate electrode includes a portion of the fourth metal film;
the fourth metal gate electrode has substantially the third work function;
a fourth channel region associated with the fourth metal gate electrode has the second minority carrier type; and
a fourth transistor includes the fourth metal gate electrode and the fourth channel region, and the fourth transistor has a fourth threshold voltage, wherein a potential difference between 0 volts and the fourth threshold voltage is greater than a potential difference between the 0 volts and the third threshold voltage.

7. The process of claim 6, wherein the third work function is substantially the same as the second work function.

8. The process of claim 6, wherein forming the semiconductor layer comprises forming the semiconductor layer wherein:
the semiconductor substrate has a first semiconductor composition;
the semiconductor layer has a second semiconductor composition different from the first semiconductor composition; and
the semiconductor layer has a thickness of at most approximately 10 nm.

9. The process of claim 1, wherein forming the first metal film, forming the second metal film, or any combination thereof is performed using an atomic layer deposition process.

10. A process for forming an electronic device comprising:
forming a first p-channel transistor including:
a first channel region including a semiconductor layer lying immediately above a semiconductor substrate, wherein:
the semiconductor substrate has a first semiconductor composition;
the semiconductor layer has a second semiconductor composition different from the first semiconductor composition; and
the semiconductor layer has a thickness of at most approximately 10 nm; and
a first metal gate electrode associated with the first channel region and having a first work function closer to a valence band of the semiconductor layer than to a conduction band of the semiconductor layer; and
a first source/drain region and a second source/drain region;
forming a first n-channel transistor including:
a second channel region lying within the semiconductor substrate; and
a second metal gate electrode associated with the second channel region and having a second work function that is substantially the same as the first work function; and
forming a second p-channel transistor including:
a third metal gate electrode overlying the semiconductor layer and having a third work function different from the first work function; and
a third source/drain region and a fourth source/drain region,
wherein forming the first and second p-channel transistors are formed such that a first shortest distance between the first source/drain region and the second source/drain region is longer than a second shortest distance between the third source/drain region and the fourth source/drain region.

11. The process of claim 10, wherein forming the first n-channel transistor and forming the first p-channel transistor are performed such that the first metal gate electrode and the second metal gate electrode each comprise TaC.

12. The process of claim 10, wherein forming the first p-channel transistor comprises forming the semiconductor layer comprising a strained semiconductor layer.

13. A process for forming an electronic device comprising:
forming a first n-channel transistor including:
a first channel region lying within a semiconductor substrate having a first semiconductor composition; and
a first metal gate electrode having a first work function closer to a conduction band than a valence band of the first channel region; and
forming a first p-channel transistor including:

a second channel region including a semiconductor layer lying immediately above the semiconductor substrate wherein:
the semiconductor layer has a second semiconductor composition different from the first semiconductor composition; and
the semiconductor layer has a thickness of at most 10 nm; and
a second metal gate electrode having a second work function different from the first work function;
forming a second n-channel transistor including:
a third channel region lying within the semiconductor substrate having substantially the first semiconductor composition; and
a third metal gate electrode having a third work function substantially the same as the first work function; and
forming a second p-channel transistor including:
a fourth channel region including the semiconductor layer; and
a fourth metal gate electrode having a fourth work function substantially the same as the first work function.

14. The process of claim 13, wherein:
forming the first n-channel transistor comprises forming the first metal gate electrode including TaC;
forming the second p-channel transistor comprises forming the second metal gate electrode including $Mo_2N$;
forming the third n-channel transistor comprises forming the first metal gate electrode including TaC; and
forming the fourth n-channel transistor comprises forming the first metal gate electrode including TaC.

15. The process of claim 13, wherein:
a threshold voltage of the first n-channel transistor is significantly different from a threshold voltage of the second n-channel transistor; and
a threshold voltage of the first p-channel transistor is significantly different from a threshold voltage of the second p-channel transistor.

16. The process of claim 13, wherein forming the first p-channel transistor comprises forming the semiconductor layer comprising a strained semiconductor layer.

17. The process of claim 10, further comprising forming a second n-channel transistor including a fourth metal gate electrode having a fourth work function that is substantially the same as the first work function.

18. The process of claim 13, wherein:
the first p-channel transistor is a low power component;
the second p-channel transistor is a high performance component;
the first n-channel transistor is another low power component; and
the second n-channel transistor is another high performance component.

19. The process of claim 10, wherein the first metal gate electrode has a different composition than the third metal gate electrode.

20. The process of claim 19, wherein the first metal gate electrode and the second gate electrode have substantially a same composition.

* * * * *